United States Patent
Choi et al.

(10) Patent No.: US 12,287,691 B2
(45) Date of Patent: Apr. 29, 2025

(54) FEEDBACK FOR POWER MANAGEMENT OF A MEMORY DIE USING A DEDICATED PIN

(71) Applicant: Lodestar Licensing Group, LLC, Evanston, IL (US)

(72) Inventors: Baekkyu Choi, San Jose, CA (US); Thomas H. Kinsley, Boise, ID (US); Fuad Badrieh, Boise, ID (US)

( * ) Notice: Subject to any disclaimer, the term of this patent is extended or adjusted under 35 U.S.C. 154(b) by 0 days.

(21) Appl. No.: 18/218,443

(22) Filed: Jul. 5, 2023

(65) Prior Publication Data

US 2024/0077926 A1 Mar. 7, 2024

Related U.S. Application Data

(63) Continuation of application No. 17/502,458, filed on Oct. 15, 2021, now Pat. No. 11,726,541, which is a continuation of application No. 16/740,293, filed on Jan. 10, 2020, now Pat. No. 11,169,587.

(51) Int. Cl.
| | | |
|---|---|---|
| G05F 1/00 | (2006.01) | |
| G06F 1/3225 | (2019.01) | |
| G06F 1/30 | (2006.01) | |
| G06F 1/3293 | (2019.01) | |

(52) U.S. Cl.
CPC .............. G06F 1/3225 (2013.01); G06F 1/30 (2013.01); G06F 1/3293 (2013.01)

(58) Field of Classification Search
CPC .................................................. G06F 1/3225
USPC ........................................................ 713/340
See application file for complete search history.

(56) References Cited

U.S. PATENT DOCUMENTS

| | | | | |
|---|---|---|---|---|
| 5,721,707 A | * | 2/1998 | Villa ...................... | G11C 16/14 365/185.29 |
| 5,796,655 A | * | 8/1998 | Reed .................. | G11C 16/3454 365/201 |
| 6,184,724 B1 | * | 2/2001 | Lin ....................... | H03K 17/302 327/143 |
| 7,257,031 B2 | * | 8/2007 | Darrer .................... | G11C 16/12 365/185.23 |
| 7,733,075 B1 | * | 6/2010 | Vasudevan ............. | G11C 5/147 323/314 |

(Continued)

FOREIGN PATENT DOCUMENTS

CN 101162605 A 4/2008

OTHER PUBLICATIONS

International Search Report and Written Opinion received for PCT Patent Application No. PCT/US20/67261, mailed on Apr. 19, 2021, 8 pages.

(Continued)

*Primary Examiner* — Volvick Derose

(57) ABSTRACT

A memory device may include a pin for communicating feedback regarding a supply voltage to a power management component, such as a power management integrated circuit (PMIC). The memory device may bias the pin to a first voltage indicating that a supply voltage is within a target range. The memory device may subsequently determine that a supply voltage is outside the target range and transition the voltage at the pin from the first voltage to a second voltage indicating that the supply voltage is outside the target range. The memory device may select the second voltage based on whether the supply voltage is above or below the target range.

6 Claims, 7 Drawing Sheets

(56) References Cited

U.S. PATENT DOCUMENTS

| | | | |
|---|---|---|---|
| 8,977,878 B2* | 3/2015 | Venkatasubramanian ................... G06F 1/3225 711/119 | |
| 9,189,053 B2 | 11/2015 | Cui et al. | |
| 9,646,692 B1* | 5/2017 | Lung .................. G11C 13/0064 | |
| 9,852,808 B2 | 12/2017 | Qian | |
| 2002/0004893 A1 | 1/2002 | Chang | |
| 2002/0036941 A1* | 3/2002 | Roohparvar ........... G11C 16/30 365/226 | |
| 2003/0099145 A1* | 5/2003 | Clark ....................... G11C 7/02 365/226 | |
| 2005/0018487 A1* | 1/2005 | Voicu .................... G11C 16/12 365/185.28 | |
| 2006/0227619 A1* | 10/2006 | Honda ................ G11C 11/5642 365/185.22 | |
| 2010/0054050 A1* | 3/2010 | Chun ................... G11C 11/406 365/222 | |
| 2013/0336067 A1* | 12/2013 | Tanaka .................. G06F 1/3225 365/185.18 | |
| 2014/0104925 A1* | 4/2014 | Azuma ................ G11C 13/004 365/148 | |
| 2014/0169095 A1* | 6/2014 | Avila ................... G11C 29/028 365/185.17 | |
| 2015/0160718 A1* | 6/2015 | Cui ....................... G06F 1/3203 713/320 | |
| 2016/0246363 A1 | 8/2016 | Chen | |
| 2017/0102760 A1* | 4/2017 | Duell ........................ G06F 1/26 | |
| 2018/0247678 A1* | 8/2018 | Vergis ....................... G11C 5/14 | |
| 2019/0079477 A1* | 3/2019 | Sanio ......................... G06F 1/28 | |
| 2019/0179685 A1* | 6/2019 | Ki ....................... G06F 12/0246 | |
| 2022/0188247 A1* | 6/2022 | Kim ........................ G06F 1/266 | |

OTHER PUBLICATIONS

Chinese patent office, "China Office Action," issued in connection with China Patent Application No. 202080092577.3 dated Feb. 24, 2025 (41 pages) (22 pages of English Translation and 19 pages of Original Document).

* cited by examiner

FEEDBACK FOR POWER MANAGEMENT OF A MEMORY DIE USING A DEDICATED PIN

CROSS REFERENCE

The present application for patent is a continuation of U.S. patent application Ser. No. 17/502,458 by Choi et al., entitled "FEEDBACK FOR POWER MANAGEMENT OF A MEMORY DIE USING A DEDICATED PIN," filed Oct. 15, 2021, which is a continuation of U.S. patent application Ser. No. 16/740,293 by Choi et al., entitled "FEEDBACK FOR POWER MANAGEMENT OF A MEMORY DIE USING A DEDICATED PIN," filed Jan. 10, 2020, each of which is assigned to the assignee hereof, and each of which is expressly incorporated by reference in its entirety herein.

BACKGROUND

The following relates generally to one or more memory systems and more specifically to feedback for power management of a memory die using a dedicated pin.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
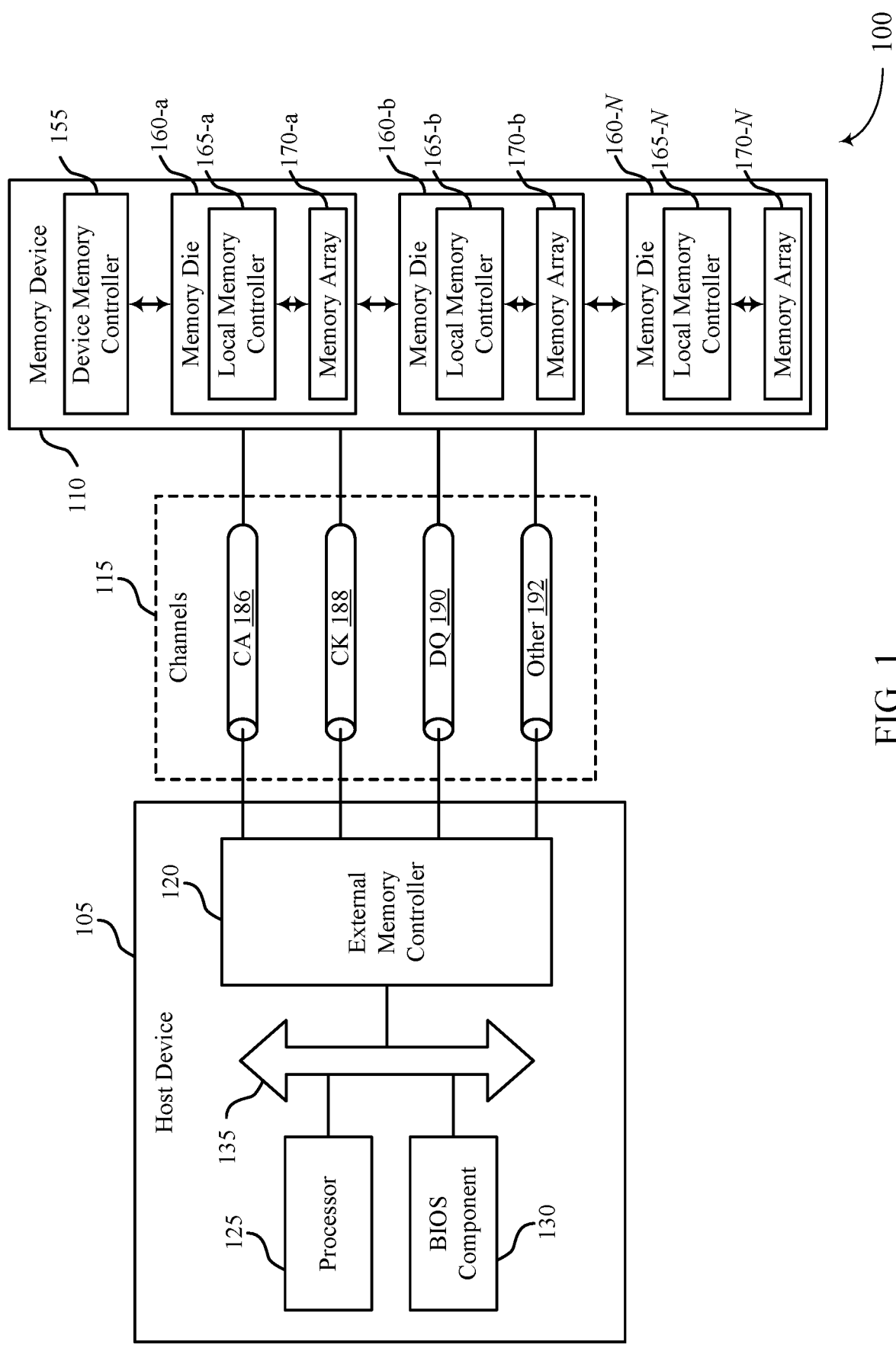
FIG. 1 illustrates an example of a system that supports feedback for power management of a memory die using a dedicated pin in accordance with examples as disclosed herein.

In some memory systems, a power management component, such as a power management integrated circuit (PMIC), may be used to manage the power supplied to one or more memory devices by controlling the voltage of a power supply rail. In some cases, the voltage on a power supply rail may be attenuated at locations farther away from the power management component due to, for example, parasitic capacitance along the rail or other factors. For memory devices that are relatively far away from the power management component, the voltage on the power supply rail may be sufficiently attenuated to drop below a minimum supply voltage, which may cause errors at the memory device. A power management component may not have access to information about the voltage at various locations along the rail, however, and may not be able to adjust the power supplied to the rail to compensate for such deviations from a target range of the voltage level.

In some examples, a memory device may include a dedicated pin (e.g., a pin that is not used for other purposes) to provide feedback, to the power management component, about the voltage level of a power supply rail at the memory device to enable the power management component to adjust the voltage appropriately. The dedicated pin may be coupled with the power management component using a conductive wire, for example. A memory device may be operable to provide feedback to the power management component by biasing a pin to a voltage level that is indicative of the voltage level of the power supply rail at the memory device. For example, a memory device may set the voltage at the pin to a first voltage to indicate that the supply voltage is within a target range, and may set the voltage at the pin to a different voltage to indicate that the supply voltage is outside of the target range. The target range may be, for example, a voltage range for a supply voltage at which the memory device is designed to operate properly, such as a supply voltage range specified by a specification document associated with the memory device. A memory device may set the voltage at the pin to one of three or more voltages, each of which may be associated with a voltage level of the power supply rail. For example, a memory device may set the voltage at the pin to a first voltage to indicate that the supply voltage is within the target range, to a second voltage to indicate that the supply voltage is below the target range, and to a third voltage to indicate that the supply voltage is above the target range. In some cases, a memory device may be operable to change a voltage at the pin from one voltage to another voltage a quantity of times (instances), with the quantity being associated with the value of the supply voltage. In some cases, a memory system may include multiple memory devices, each of which may include a dedicated pin to provide feedback to the power management component as described above.

The power management component, in turn, may be operable to detect the voltage at a dedicated pin of a memory device, a change in voltage at the pin, and/or a quantity of voltage transitions at the pin. In cases where the power management component is coupled with multiple memory devices that each include its own pin, the power management component may be operable to detect such feedback at each pin, or to detect combined feedback from all of the pins. The power management component may use such feedback information to determine whether and how to adjust the power (e.g., the supply voltage) that is supplied to the memory device via the power supply rail; that is, the power management component may adjust the voltage of a rail based on the feedback received from one or more memory devices.

Features of the disclosure are further described below in the context of memory systems and dies with reference to FIG. 1. Features of the disclosure are then described in the context of systems and voltage signals with reference to FIGS. 2-4. These and other features of the disclosure are further illustrated by and described with reference to an apparatus diagram and flowcharts in FIGS. 5-7 that relate to feedback for power management of a memory die using a dedicated pin.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

In some examples, a memory die 160 may be coupled with a power management component that is operable to provide one or more supply voltages to the memory die 160. For example, the power management component may supply a VDD voltage, a VSS voltage, a VDDQ voltage, etc. using power supply rails (e.g., conductive lines). The power management component may be operable to maintain a substantially constant supply voltage on the rail to provide power to the memory device 110 or memory die 160 during operation. The power management component may include or may be coupled with one or more voltage supply components that are operable to generate the appropriate supply voltage. In some cases, the power management component may be referred to as a PMIC or a registered clock device (RCD).

In some cases, the voltage along a power supply rail may decrease along the rail as the distance from the power management component increases due to, for example, parasitic capacitance along the rail. Thus, if multiple memory dies 160 are coupled with a power supply rail that provides a supply voltage to the memory dies 160, a memory die 160 that is relatively far away from the power management component may receive a lower supply voltage than a memory die 160 that is closer to the power management component. In some cases, if the supply voltage dips below a lower voltage threshold, the memory die 160 may experience memory errors.

A memory die 160 (or memory device 110) may include a dedicated pin for providing feedback to the power management component regarding the supply voltage on the power supply rail at the memory die, thereby enabling the power management component to adjust the supply voltage appropriately.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controllers 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

A local memory controller 165 of a memory die 160 may be operable to determine whether a supply voltage is outside a target range associated with the supply voltage. If the local memory controller 165 determines that the supply voltage is outside the target range, the local memory controller 165 may transition (e.g., change) a voltage at a pin of the memory die 160 from a first voltage indicating that the supply voltage is within the range to a second voltage indicating that the supply voltage is outside of the range.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
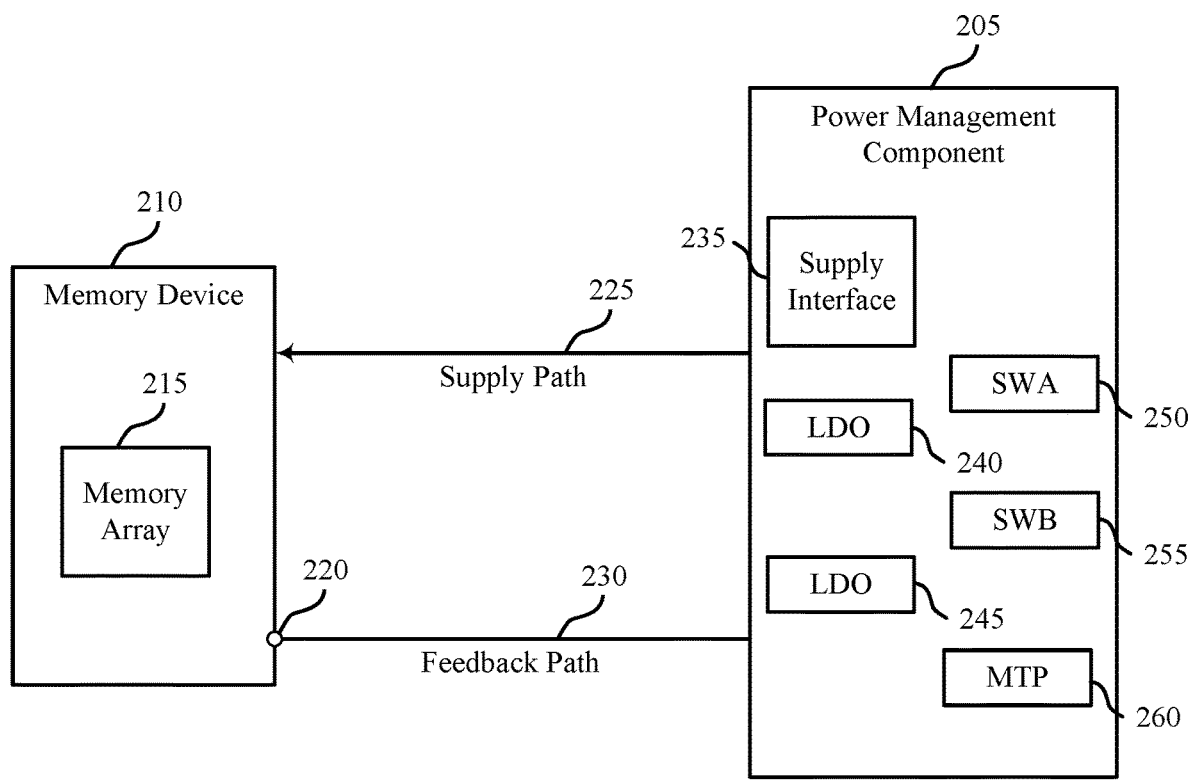
FIG. 2 shows an example of a memory system that supports feedback for power management of a memory die using a dedicated pin in accordance with examples as disclosed herein.

FIG. 2 illustrates an example of a memory system 200 that supports feedback for power management of a memory die using a dedicated pin. The memory system 200 may include a power management component 205, a memory device 210 that includes a memory array 215, and a feedback path 230 and supply path 225 between the power management component 205 and the memory device 210. In the example of memory system 200, the feedback path 230 and/or supply path 225 may be an example of conductive lines that couple the power management component 205 with the memory device 210. The memory device 210 may be an example of a memory device 110 as described with reference to FIG. 1.

Memory array 215 may be an example of memory array 170 as described with reference to FIG. 1.

The power management component 205 may include a supply interface 235, low-dropout regulators (LDO) 240, 245, power supplies (SWA, SWB) 250, 255 (e.g., switching regulators), and multi-time programmable memory (MTP) 260. The supply interface 235 may be operable to receive power to activate the power management component 205 and to be distributed to other components of a memory system (e.g., memory device 210) through the power management component 205.

The low-dropout regulators 240, 245 may be used for outputting power (e.g., DC power) to memory devices of the memory system, including memory device 210. In some cases, the low-dropout regulators 240, 245 may be used to regulate an output voltage, such as a supply voltage. The power supplies 250, 255 may be used for outputting power to memory devices of the memory system, including memory device 210. The power management component 205 may include any quantity of low-dropout regulators (e.g., one, two, three, four, five, six, seven, eight), or may include any quantity of power supplies (e.g., one, two, three, four, five, six, seven, eight), or any quantity of both.

The multi-time programmable memory 260 may be any type of memory used by the power management component 205 for performing the functions described herein. In some cases, the multi-time programmable memory 260 may be an example of an electrically erasable programmable read-only memory (EEPROM) or other type of memory technology. The multi-time programmable memory 260 may be for protecting circuits, improving a reliability of a power-on sequence or a power-off sequence, setting of output voltage (s), setting of output pull-down resistance(s), or other functions, or any combination thereof.

The memory device 210 may include a pin 220 for providing feedback to a power management component. A pin may be, for example, a conductive terminal of an integrated circuit package that allows the integrated circuit to be connected with other components or circuitry. A pin 220 may also be referred to as a pad, a socket, a connector, a contact, or a ball (for a ball grid array), for example. In some cases, a pin 220 may be a conductive point that is within an integrated circuit package or external to the integrated circuit package. In some cases, a pin 220 may be associated with a predefined functionality (e.g., a predefined type or format of signal) that may be specified, for example, as part of a standardized interface that allows an integrated circuit to be connected to other circuitry or components. In some cases, pin 220 may be a dedicated pin that is associated with a single function (e.g., for providing feedback), and may not be used for purposes other than the single function.

The feedback path 230 may couple the pin 220 of the memory device 210 with the power management component 205. The feedback path 230 may include any set of one or more lines that establish a communicative link between the memory device 210 and the power management component 205. The feedback path 230 may directly couple the memory device 210 and the power management component 205, meaning that the feedback path 230 may establish a connection between the two components that allows a signal to be routed between the components using conductive lines.

The supply path 225 may be a power supply rail (or may be coupled with a power supply rail) to enable the power management component 205 to provide a supply voltage to memory device 210, for example. A supply voltage may be used by memory device 210 during operation of memory device 210, and may include, for example, a VDD voltage, a VSS voltage, or another supply voltage.

Techniques are provided herein for using the pin 220 to provide feedback to the power management component 205 by transitioning a voltage at the pin 220 from a first voltage to a second voltage based on determining that a supply voltage provided by the power management component 205 is outside a target range. The voltage at the pin 220 or voltage transitions at the pin 220 may be detected by the power management component 205 (and/or by another device, such as a host device) and may be used by the power management component 205 to regulate (e.g., maintain or adjust) a voltage supplied to memory device 210 (e.g., using supply path 225) or to regulate another operational aspect of memory device 210.

Figure 3:
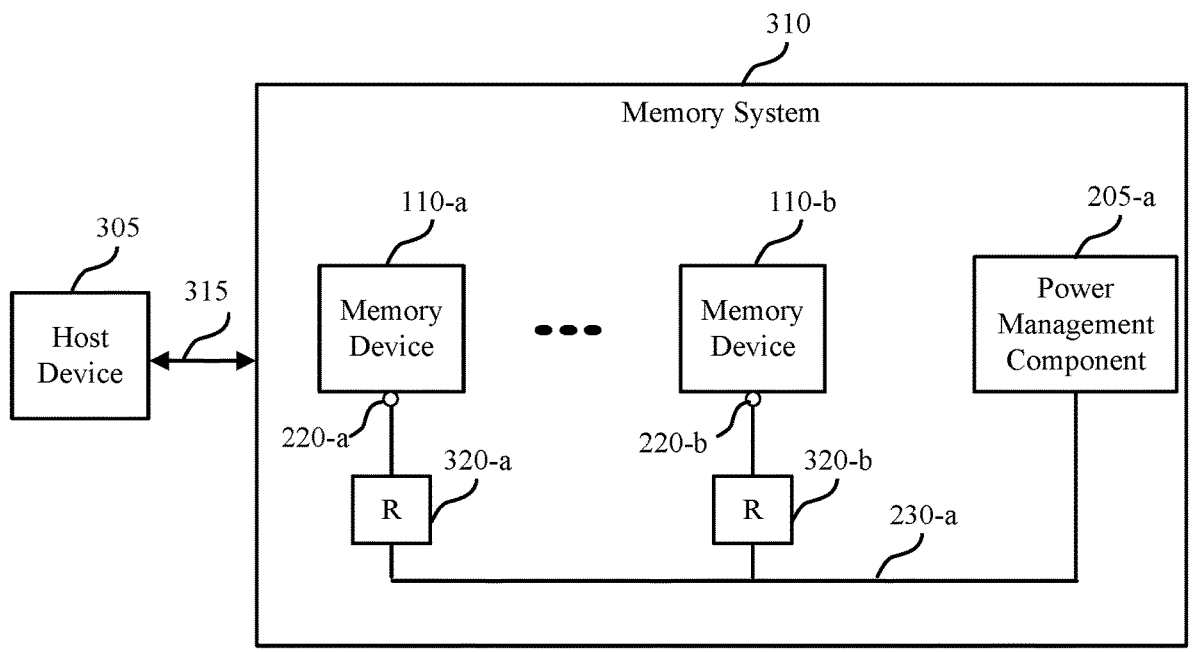
FIG. 3 shows an example of a memory system that supports feedback for power management of a memory die using a dedicated pin in accordance with examples as disclosed herein.

FIG. 3 illustrates an example of a system 300 in accordance with examples as disclosed herein. The system 300 includes a host device 305 and a memory system 310. The host device 305 and the memory system 310 may be coupled or connected (e.g., electrically) with each other over a channel 315 (e.g., a common channel, a shared channel). The host device 305 may refer to a device that uses the memory systems 310 for data storage, or otherwise coordinates the use of the memory systems 310 for data storage.

The memory system 310 may include one or more memory devices 110 (e.g., memory devices 110-a, 110-b) that may be examples of a memory device 110 described with reference to FIG. 1, such as a DRAM device. Each memory device 110 may include a pin 220 (e.g., pins 220-a, 220-b) for providing feedback to a power management component 205-a. In some cases, pins 220-a, 220-b may be dedicated pins. Power management component 205-a may be an example of power management component 205 as described with reference to FIG. 2.

In some examples, a memory system 310 may refer to a set of components that are physically distinct from a host device 305, such as a memory module or a memory assembly. For example, a memory system 310 may refer to a single in-line memory module (SIMM), a dual-in-line memory module (DIMM), or another type of module or assembly. In some cases, a SIMM or DIMM may include a power management component (e.g., as depicted in memory system 310). In some cases, the power management component 205-a may be external to the SIMM or DIMM.

In some cases, a memory system 310 may include a single DRAM integrated circuit (e.g., a single memory device 110). A memory system 310 may include a first quantity of pins (e.g., 72 pins or another quantity of pins) that may be used, for example, to couple the memory system 310 with a power management component, a host processor, or other electronic components. Each pin of a memory system 310 may support 32-bit data transfers.

In some cases, a memory system 310 may include a series of DRAM integrated circuits, such as a series of memory devices 110. A memory system 310 may include a second quantity of pins (e.g., 100, 144, 168, 172, 184, 204, 214, 240, or another quantity of pins) that may be used, for example, to couple the memory system 310 with a power management component, a host processor, or other electronic components. Each pin of a memory system 310 may support 64-bit data transfers. In some cases, the DRAMs in a memory system 310 are coupled with one or more power supply rails, and DRAMs that are farther away from the voltage supply may receive a lower voltage on the power supply rail than DRAMs that are closer to the voltage supply.

In some cases, the above-described quantity of pins for a memory system 310 may include a dedicated pin for providing feedback to a power management component, as described herein. In some cases, an additional pin may be added to the memory system 310 to provide this functionality, and thus the quantity of pins may be increased by one relative to the above-described quantity of pins for a memory system 310.

In some cases, memory device 110 may bias (e.g., set, drive) the voltage at pin 220 to a first voltage indicating that the supply voltage is within the target range. For example, memory device 110 may determine that the supply voltage is within the target range and may bias the voltage at pin 220 to the first voltage based on determining that the supply voltage is within the target range.

In some cases, memory device 110 may determine whether a supply voltage used during operation of memory device 110 is outside of a target range. If memory device 110 determines that the supply voltage is outside of the target range, memory device 110 may transition the voltage at the pin 220 from the first voltage to a second voltage indicating that the supply voltage is outside of the target range. For example, the second voltage may indicate that the supply voltage is below a lower voltage threshold of the target range or that the supply voltage is above a higher voltage threshold of the target range.

In some cases, memory device 110 may use two-level voltage feedback. For example, memory device 110 may determine whether the supply voltage is within the target range or below a lower voltage threshold of the target range. If memory device 110 determines that the supply voltage is within the target range, memory device 110 may bias the pin 220 to a first voltage indicating that the supply voltage is within the target range. If memory device 210 determines that the supply voltage is below a lower voltage threshold of the target range, memory device 110 may transition the voltage at the pin 220 to a second voltage indicating that the supply voltage is below the lower voltage threshold. In some cases, the second voltage may be below the first voltage. Two-level voltage feedback is described with reference to FIG. 4A.

In some cases, memory device 110 may use three-level voltage feedback. For example, memory device 110 may determine whether the supply voltage is within the target range, below a lower voltage threshold of the target range, or above a higher voltage threshold of the target range. If memory device 110 determines that the supply voltage is within the target range, memory device 110 may bias the pin 220 to a first voltage indicating that the supply voltage is within the target range. If memory device 210 determines that the supply voltage is below a lower voltage threshold of the target range, memory device 110 may transition the voltage at the pin 220 to a second voltage that is below the first voltage. If memory device 110 determines that the supply voltage is above a higher voltage threshold of the target range, memory device 110 may transition the voltage at the pin 220 to a third voltage. In some cases, the third voltage may be between the first voltage and the second voltage, or may be below the second voltage, or may be above the first voltage.

In some cases, if memory device 110 determines that the supply voltage is outside the target range, memory device 110 may select a voltage level (e.g., select the second voltage or the third voltage) based on whether the supply voltage is below a lower voltage threshold of the target range or above a higher voltage threshold of the target range, and transition the voltage at the pin from the first voltage to the selected voltage level (e.g., the second voltage or the third voltage). Three-level voltage feedback is described with reference to FIG. 4B.

In some cases, memory device 110 may be operable to determine a value (e.g., a voltage value) of the supply voltage. Memory device 110 may indicate the value of the supply voltage by causing a quantity of voltage transitions at the pin 220, such a voltage transitions between the first voltage and the second voltage, the second voltage and the third voltage, the first voltage and the third voltage, or transitions between other voltages.

In some cases, the quantity of voltage transitions may be based on the value of the supply voltage. For example, memory device may transition the voltage at the pin a first quantity of times (e.g., instances) based on determining a first value of the supply voltage, and may transition the voltage at the pin a second quantity of times based on determining a second value of the supply voltage.

In some cases, the voltages used for the voltage transitions may be based on the value of the supply voltage. For example, memory device 110 may transition the voltage at the pin from a first voltage to a second voltage based on determining a first value of the supply voltage, and may transition the voltage at the pin from a third voltage to a fourth voltage based on determining a second value of the supply voltage.

In some cases, memory device 110 may be operable to provide feedback to the power management component 205 using an asynchronous protocol. The asynchronous protocol may include, for example, multi-bit signaling based on transitions in voltage levels at pin 220. That is, memory device 110 may generate a multi-bit signal (e.g., based on the value of the supply voltage), and transmit the multi-bit signal using the pin 220. Such a multi-bit signal may include an indication of the value of the supply voltage, an identifier of the memory device 110 (e.g., a DRAM identifier), an indication of whether the supply voltage is above a higher voltage threshold or below a lower voltage threshold, a difference between the value of the supply voltage and a target value, other information related to the supply voltage or the memory device 110, or a combination of these.

In some cases, power management component 205-a may be operable to detect a voltage at pin 220 (e.g., via feedback path 230). For example, power management component 205-a may be operable to poll the voltage at the pin 220 or on feedback path 230-a at periodic time intervals, or based on other timings or conditions. In some cases, power management component 205-a may be operable to detect a quantity of voltage transitions at the pin 220, such as a quantity of transitions initiated by the memory device 110. In some cases, power management component 205-a may be operable to detect asynchronous, multi-bit signaling by capturing a quantity of voltage transitions at the pin 220.

In some cases, power management component 205-a may, based on the voltage detected at a pin 220, a quantity of transitions at a pin 220, asynchronous, multi-bit signaling at a pin 220, or a combination of these, maintain or adjust the power supplied to the memory device 110. Power management component 205-a may for example, maintain, increase, or decrease the voltage on the supply rail using LDO 240, 245, SA 250, 255, MTP 260, or a combination of these components.

Memory device 110 may be operable to receive an adjusted supply voltage (e.g., from power management component 205-a) based on (e.g., after) transitioning the voltage at the pin 220.

The power management component 205-a may be coupled with multiple memory devices 110-a, 110-b using a single feedback path 230-a. In this case, each memory device 110 may provide an indication of the supply voltage at the memory device 110, which may be different for memory device 110-a and memory device 110-b, for example. Thus, in some cases, the supply voltage at memory device 110-a may be outside of the target range, but the supply voltage at memory device 110-b may be within the target range (or vice versa). In this case, the feedback provided by memory device 110-a at pin 220-a may conflict with the feedback provided by memory device 110-b at pin 220-b, which may lead to challenges for the power management component 205-a with respect to regulating the power supply to the memory devices 110.

To address such challenges, in some cases, each memory device 110 in a memory system 310 may be coupled with an in-line resistor 320 between the pin 220 of the memory device 110 and the power management component 205-a to weight the feedback from each memory device 110. For example, pin 220-a of memory device 110-a may be coupled with resistor 320-a to weight feedback from memory device 110-a, and pin 220-b of memory device 110-b may be coupled with resistor 320-b to weight the feedback from memory device 110-b. The values of resistor 320-a and resistor 320-b may be different, and may be selected (for example, during the design of the memory device 110) to provide a different weighting for the feedback from memory device 110-a and memory device 110-b. For example, the values of resistor 320 may be selected based on the location of memory device 110 within the memory system 310 or based on the proximity of the memory device 110 to a power supply. In this manner, resistors 320-a, 320-b may enable multiple memory devices 110 to be coupled with a single feedback path 230-a and provide a single, combined feedback signal in which the contributions from each memory device 110 are weighted by the value of the corresponding resistor 320.

In some cases, each memory device 110 may be coupled with power management component 205-a using a separate point-to-point connection (e.g., a separate feedback path), and power management component 205-a may internally weight or otherwise process the feedback from each memory device 110 to determine how to adjust a supply voltage.

In some cases, each memory device 110 may apply a different drive strength at pin 220 to weight the feedback of each memory device 110. In some cases, a drive strength may be an amount of electrical current that is sourced (e.g., supplied) or sunk (e.g., received) at pin 220 while outputting or maintaining a given voltage at pin 220. For example, each memory device 110 may be pre-configured to apply a particular drive strength at pin 220 based on, for example, the location of the memory device 110 within the memory system 310 or the proximity (e.g., electrical proximity) of the memory device 110 to the power supply.

Figure 4A:
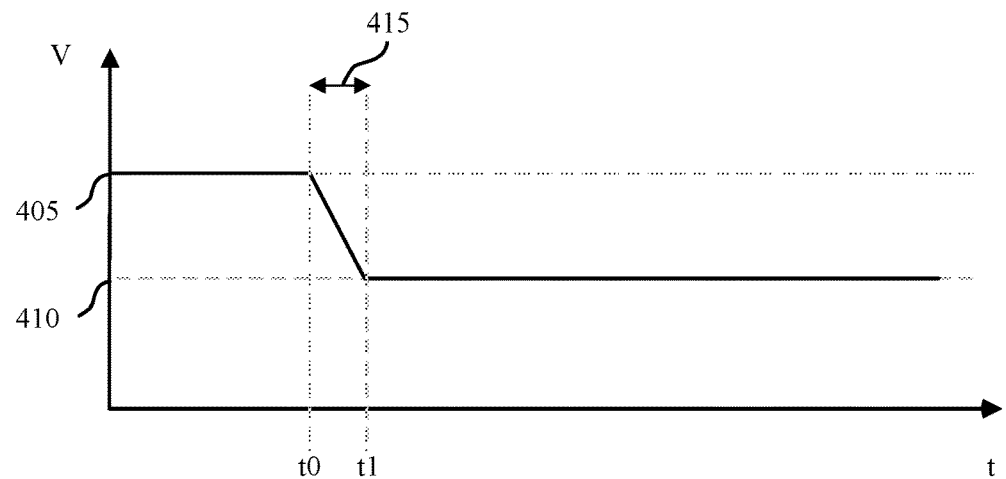
FIGS. 4A, 4B, and 4C show examples of voltage signals that support feedback for power management of a memory die using a dedicated pin in accordance with examples as disclosed herein.

FIG. 4A depicts an example of voltage signals that support feedback for power management of a memory die using a dedicated pin in accordance with examples disclosed herein. FIG. 4A may depict voltages that are output on a dedicated pin (such as pin 220) by a memory device (e.g., memory device 110) to provide two-level voltage feedback to a power management component (e.g., power management component 205) or to another device.

At or before time t0, a memory device may bias a pin to a first voltage 405 indicating that a supply voltage is within a target range. The first voltage 405 may be, for example, a VDD voltage or another voltage.

At time t0, the memory device may determine that the supply voltage is outside of the target range. The memory device may, based on determining that the supply voltage is outside of the target range, transition the voltage at the pin from the first voltage 405 to a second voltage 410 (e.g., during a transition 415 that occurs between time t0 and time t1) indicating that the supply voltage is outside of the target range. In some cases, the transition 415 may last a duration of time, such as from t0 to t1. In some cases, the second voltage 410 may be lower than the first voltage 405, as depicted in FIG. 4A. For example, the second voltage 410 may be a ground voltage, VDD/2, or another voltage. In other cases, the second voltage 410 may be higher than the first voltage 405. In some cases, the memory device may maintain the voltage at the pin at the second voltage for a duration of time after the transition 415. For example, the memory device may maintain the voltage at the second voltage for a pre-defined duration of time, or for as long as the memory device continues to detect that the supply voltage is outside the target range. In some cases, the memory device may maintain the voltage at the second voltage until the memory device determines that the supply voltage has returned to being within the target range, or until the memory device determines that the supply voltage has changed in another manner.

Figure 4B:
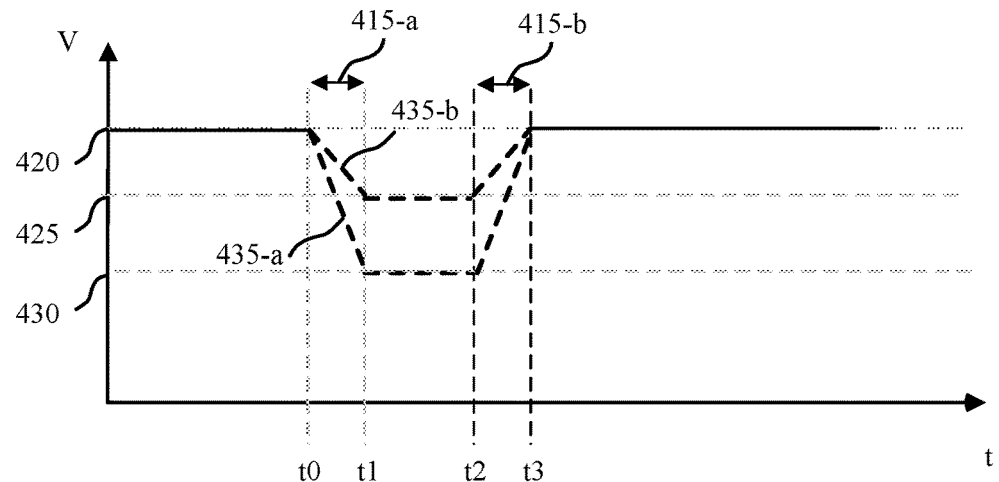

FIG. 4B depicts two examples (435-a, 435-b) of voltage signals that support feedback for power management of a memory die using a dedicated pin in accordance with examples as disclosed herein. FIG. 4B may depict voltages that are output on a dedicated pin (such as pin 220) by a memory device (e.g., memory device 110) to provide three-level voltage feedback to a power management component (e.g., power management component 205) or to another device.

Before time t0, a memory device may bias a pin to a first voltage 420 indicating that a supply voltage is within a target range. The first voltage 420 may be, for example, a VDD voltage, or another voltage.

At or before time t0, the memory device may determine that the supply voltage is outside of the target range.

In the example of 435-a, the memory device may determine that the supply voltage is outside of the target range by determining that the supply voltage is below a lower voltage threshold of the target range.

In this case, at to, the memory device may, based on determining that the supply voltage is below the lower voltage threshold of the target range, transition the voltage at the pin from the first voltage 420 to a second voltage 430 (e.g., during a first transition 415-a that occurs between time t0 and time t1) indicating that the supply voltage is below the lower threshold voltage, as depicted in example 435-a. In example 435-a, the second voltage 430 is below the first voltage 420. For example, the second voltage 430 may be a ground voltage or another voltage below the first voltage 420.

Alternatively, as depicted in example 435-b, the memory device may determine that the supply voltage is outside of the target range by determining that the supply voltage is above an upper voltage threshold of the target range. The memory device may, based on determining that the supply voltage is above the upper voltage threshold of the target range, transition the voltage at the pin from the first voltage 420 to a third voltage 425 (e.g., during a first transition 415-a) indicating that the supply voltage is above the upper threshold voltage. In the examples of FIG. 4B, the third voltage 425 is between the first voltage 420 and the second voltage 430. For example, the third voltage 425 may be VDD/2 or another voltage between the first voltage and the third voltage.

In some cases, a memory device 110 may select the second voltage or the third voltage based on whether the supply voltage is below or above the target range, respectively, and may transition the voltage at the pin 220 to the selected voltage level (e.g., the second voltage or the third voltage).

In some cases, a power management component may detect second voltage 430, third voltage 425, first transition 415-a, or a combination of these, and adjust the supply voltage such that the supply voltage at the memory device returns to being within the target range.

At time t2, the memory device may determine that the supply voltage is again within the target range. The memory device may, based on determining that the supply voltage is within the target range, transition the voltage at the pin from the second voltage 430 to the first voltage 420 (for example 435-b) or from the third voltage 425 to the first voltage 420 (for example 435-a) during a second transition 415-b, which occurs between time t2 and time t3.

Figure 4C:
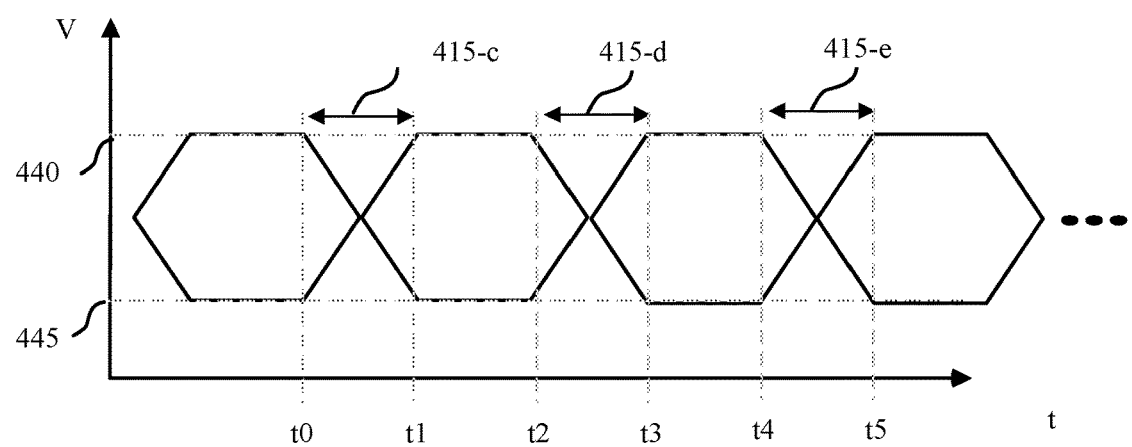

FIG. 4C depicts an example of voltage signals that support feedback for power management of a memory die using a dedicated pin in accordance with examples as disclosed herein. FIG. 4C may depict voltages that are output on a dedicated pin (such as pin 220) by a memory device (e.g., memory device 110) to provide feedback using a multi-bit signal to a power management component (e.g., power management component 205) or to another device.

Before time t0, a memory device may bias a pin to a first voltage 440 indicating that a supply voltage is within a target range. The first voltage 440 may be, for example, a VDD voltage, or another voltage.

At or before time t0, the memory device may determine that the supply voltage is outside of the target range, which may include determining a value of the supply voltage.

In some cases, the memory device may determine a quantity of transitions based on the value of the supply voltage. The memory device may then transition the voltage at a pin the quantity of transitions. For example, the example of FIG. 4C includes at least three transitions 415-c, 415-d, 415-e.

In some cases, the quantity of transitions may provide a multi-bit signal that indicates, for example, that the supply voltage is outside of the target range, the value of the supply voltage, an identifier of the memory device, or a combination of these. In some cases, the multi-bit signal may be an asynchronous signal; that is, the multi-bit signal may be unsynchronized (not synchronized) with a clock signal of the memory device 110.

Figure 5:
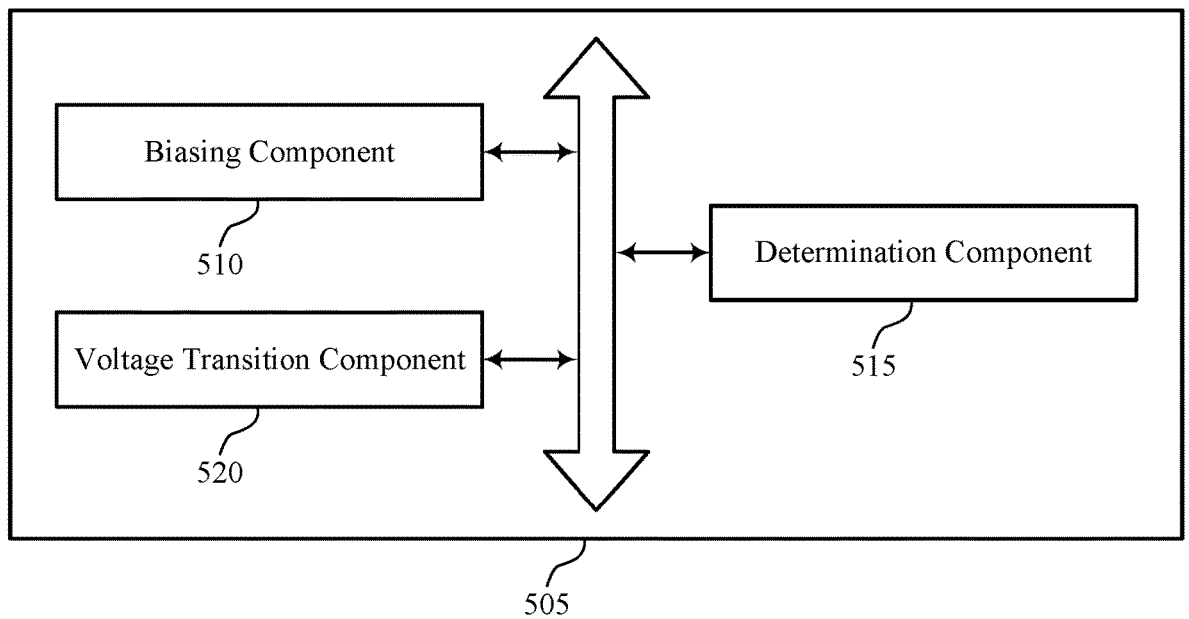
FIG. 5 shows a block diagram of a memory device that supports feedback for power management of a memory die using a dedicated pin in accordance with examples as disclosed herein.

FIG. 5 shows a block diagram 500 of a memory device 505 that supports feedback for power management of a memory die using a dedicated pin in accordance with examples as disclosed herein. The memory device 505 may be an example of aspects of a memory device as described with reference to FIGS. 1 through 4. The memory device 505 may include a biasing component 510, a determination component 515, and a voltage transition component 520. Each of these modules may communicate, directly or indirectly, with one another (e.g., via one or more buses).

The biasing component 510 may bias a pin of a memory device to a first voltage indicating that a supply voltage associated with the memory device is within a target range. In some examples, the biasing component 510 may bias the pin to a third voltage between the first voltage and the second voltage, where the third voltage indicates that the supply voltage is above the higher voltage threshold.

The determination component 515 may determine, after biasing the pin of the memory device to the first voltage, that the supply voltage is outside the target range.

In some examples, the determination component 515 may determine, at a first time, that the supply voltage is below a lower voltage threshold of the target range, where determining that the supply voltage is outside of the target range is based on determining that the supply voltage is below the lower voltage threshold. In some examples, the determination component 515 may determine, at a second time, that the supply voltage is above a higher voltage threshold of the target range.

The voltage transition component 520 may transition a voltage at the pin of the memory device from the first voltage to a second voltage indicating that the supply voltage is outside the target range based on determining that the supply voltage is outside the target range.

Figure 6:
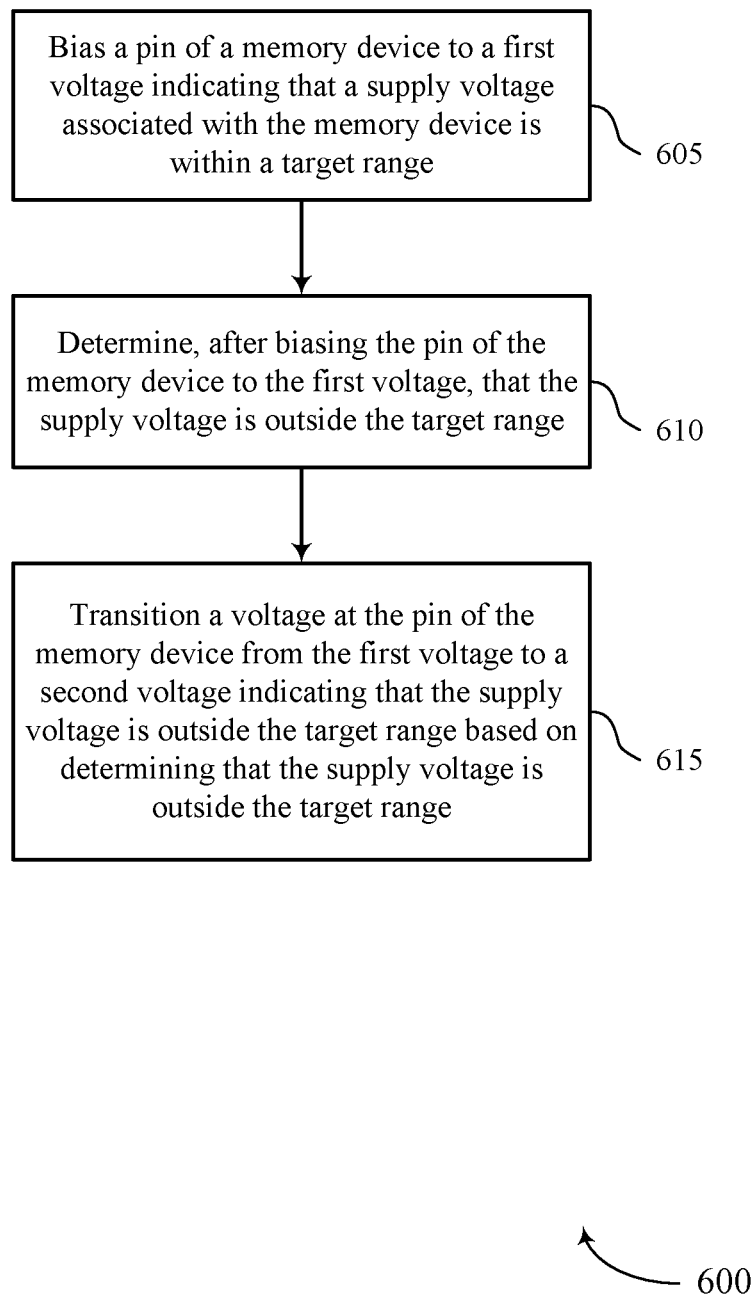
FIGS. 6 and 7 show flowcharts illustrating a method or methods that support feedback for power management of a memory die using a dedicated pin in accordance with examples as disclosed herein.

FIG. 6 shows a flowchart illustrating a method or methods 600 that supports feedback for power management of a memory die using a dedicated pin in accordance with examples as disclosed herein. The operations of method 600 may be implemented by a memory device or its components as described with reference to FIGS. 1-4. In some examples, the operations of method 600 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 605, the memory device may bias a pin of a memory device to a first voltage indicating that a supply voltage associated with the memory device is within a target range. The operations of 605 may be performed according to the methods described with reference to FIGS. 2-4. In some examples, aspects of the operations of 605 may be performed by a biasing component as described with reference to FIG. 5.

At 610, the memory device may determine, after biasing the pin of the memory device to the first voltage, that the supply voltage is outside the target range. The operations of 610 may be performed according to the methods described with reference to FIGS. 2-4. In some examples, aspects of the operations of 610 may be performed by a determination component as described with reference to FIG. 5.

At 615, the memory device may transition a voltage at the pin of the memory device from the first voltage to a second voltage indicating that the supply voltage is outside the target range based on determining that the supply voltage is outside the target range. The operations of 615 may be performed according to the methods described with reference to FIGS. 2-4. In some examples, aspects of the operations of 615 may be performed by a voltage transition component as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for biasing a pin of a memory device to a first voltage indicating that a supply voltage associated with the memory device is within a target range.

Some examples of the method 600 and the apparatus described herein may further include operations, features, means, or instructions for determining, after biasing the pin of the memory device to the first voltage, that the supply voltage is outside the target range.

Some examples of the method 600 and the apparatus described herein may further include operations, features, means, or instructions for transitioning a voltage at the pin of the memory device from the first voltage to a second voltage indicating that the supply voltage is outside the target range based on determining that the supply voltage is outside the target range.

Figure 7:
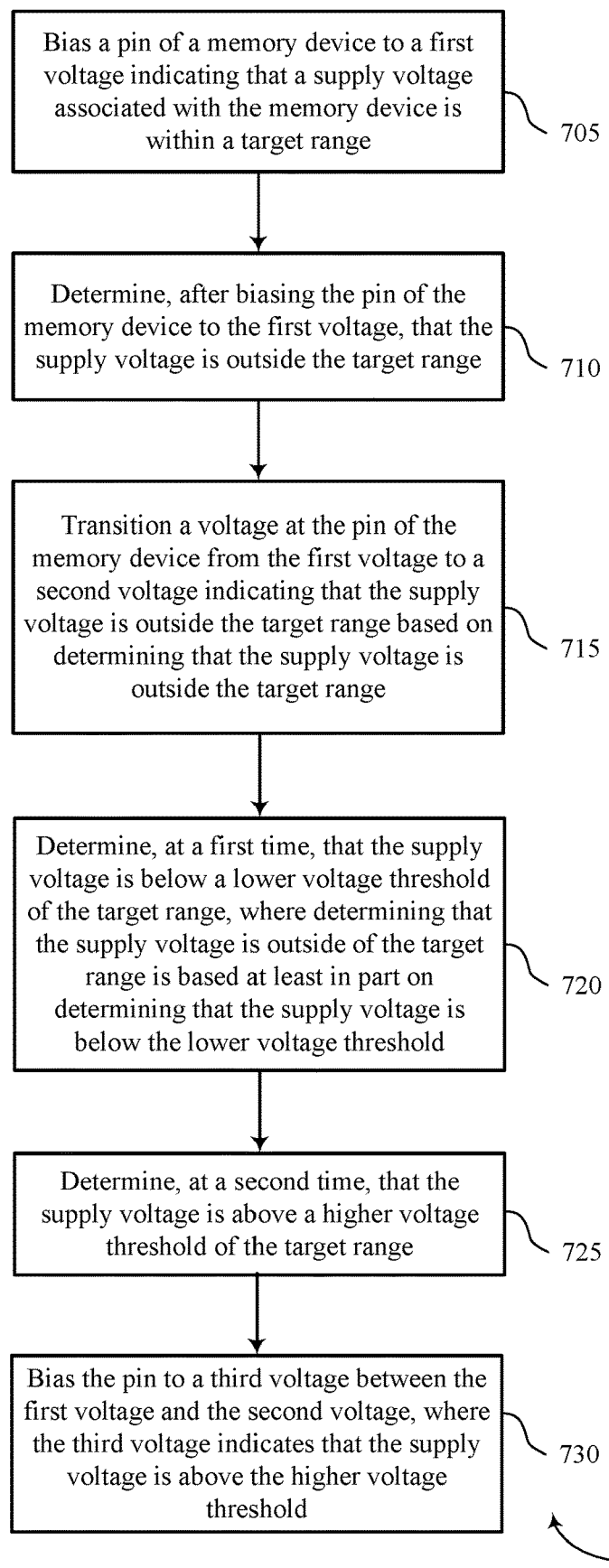

FIG. 7 shows a flowchart illustrating a method or methods 700 that supports feedback for power management of a memory die using a dedicated pin in accordance with examples as disclosed herein. In some examples, the operations of method 700 may be implemented by a memory device or its components as described with reference to FIGS. 1-4. In some examples, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may bias a pin of a memory device to a first voltage indicating that a supply voltage associated with the memory device is within a target range. The operations of 705 may be performed according to the methods described with reference to FIGS. 2-4. In some examples, aspects of the operations of 705 may be performed by a biasing component as described with reference to FIG. 5.

At 710, the memory device may determine, after biasing the pin of the memory device to the first voltage, that the supply voltage is outside the target range. The operations of 710 may be performed according to the methods described with reference to FIGS. 2-4. In some examples, aspects of the operations of 710 may be performed by a determination component as described with reference to FIG. 5.

At 715, the memory device may transition a voltage at the pin of the memory device from the first voltage to a second voltage indicating that the supply voltage is outside the target range based on determining that the supply voltage is outside the target range. The operations of 715 may be performed according to the methods described with reference to FIGS. 2-4. In some examples, aspects of the operations of 715 may be performed by a voltage transition component as described with reference to FIG. 5.

At 720, the memory device may determine, at a first time, that the supply voltage is below a lower voltage threshold of the target range, where determining that the supply voltage is outside of the target range is based at least in part on determining that the supply voltage is below the lower voltage threshold. The operations of 720 may be performed according to the methods described with reference to FIGS. 2-4. In some examples, aspects of the operations of 720 may be performed by a voltage transition component as described with reference to FIG. 5.

At 725, the memory device may determine, at a second time, that the supply voltage is above a higher voltage threshold of the target range. The operations of 725 may be performed according to the methods described with reference to FIGS. 2-4. In some examples, aspects of the operations of 725 may be performed by a voltage transition component as described with reference to FIG. 5.

At 730, the memory device may bias the pin to a third voltage between the first voltage and the second voltage, where the third voltage indicates that the supply voltage is above the higher voltage threshold. The operations of 730 may be performed according to the methods described with reference to FIGS. 2-4. In some examples, aspects of the operations of 730 may be performed by a voltage transition component as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for biasing a pin of a memory device to a first voltage indicating that a supply voltage associated with the memory device is within a target range.

Some examples of the method 700 and the apparatus described herein may further include operations, features, means, or instructions for determining, after biasing the pin of the memory device to the first voltage, that the supply voltage is outside the target range.

Some examples of the method 700 and the apparatus described herein may further include operations, features, means, or instructions for transitioning a voltage at the pin of the memory device from the first voltage to a second voltage indicating that the supply voltage is outside the target range based on determining that the supply voltage is outside the target range.

Some examples of the method 700 and the apparatus described herein may further include operations, features, means, or instructions for determining, at a first time, that the supply voltage is below a lower voltage threshold of the target range, where determining that the supply voltage is outside of the target range is based at least in part on determining that the supply voltage is below the lower voltage threshold.

Some examples of the method 700 and the apparatus described herein may further include operations, features, means, or instructions for determining, at a second time, that the supply voltage is above a higher voltage threshold of the target range.

Some examples of the method 700 and the apparatus described herein may further include operations, features, means, or instructions for biasing the pin to a third voltage between the first voltage and the second voltage, where the third voltage indicates that the supply voltage is above the higher voltage threshold.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells, a pin for transmitting, to a power management component, a signal indicating feedback about a supply voltage used during operation of the array of memory cells, and a controller operable to cause the apparatus to determine that the supply voltage is outside a target range associated with the supply voltage and transition a voltage at the pin from a first voltage to a second voltage indicating that the supply voltage is outside the target range.

Some examples may further include determining, at a first time, that the supply voltage may be below a lower voltage threshold of the target range, where determining that the supply voltage may be outside of the target range may be based on determining that the supply voltage may be below the lower voltage threshold. Some examples may further include biasing the pin to the first voltage to indicate that the supply voltage may be within the target range before determining that the supply voltage may be below the lower voltage threshold, where modifying the voltage at the pin from the first voltage to the second voltage indicates that the supply voltage may be below the lower voltage threshold.

Some examples may further include determining, at a second time, that the supply voltage may be above a higher voltage threshold, where determining that the supply voltage may be outside of the target range may be based on determining that the supply voltage may be above the higher voltage threshold. Some examples may further include biasing the pin to a third voltage indicating that the supply voltage may be above the higher voltage threshold. In some examples, the second voltage may be below the first voltage and the third voltage may be between the first voltage and the second voltage.

Some examples may further include selecting a voltage level of the second voltage based on determining whether the supply voltage may be below a lower voltage threshold of the target range or above a higher voltage threshold of the target range, where a first voltage level indicates the supply voltage may be below the lower voltage threshold and a second voltage level indicates that the supply voltage may be above the higher voltage threshold. Some examples may further include determining a value of the supply voltage, where determining that the supply voltage may be outside of the target range may be based on determining the value of the supply voltage, and transition the voltage at the pin between two or more voltage levels a quantity of times, including the transitioning of the voltage from the first voltage to the second voltage, based on the value of the supply voltage. Some examples may further include determining the quantity of times based on the value of the supply voltage.

In some examples, transitioning the voltage at the pin between the two or more voltage levels the quantity of times may include operations, features, means, or instructions for biasing the pin to a third voltage different than the second voltage after transitioning the pin from the first voltage to the second voltage. Some examples may further include generating a multi-bit signal based on the value of the supply voltage, and transmitting the multi-bit signal using the pin. In some examples, the multi-bit signal includes an indication of the value of the supply voltage, an identifier of the apparatus, an indication of whether the supply voltage may be above a higher voltage threshold or below a lower voltage threshold, or a combination thereof. In some examples, the pin may be dedicated for providing feedback to the power management component. Some examples may further include receiving an adjusted supply voltage based on transitioning the voltage at the pin. Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory system, comprising:
a dual-in-line memory module (DIMM); and
a power management integrated circuit (PMIC) coupled with the DIMM, wherein the PMIC is configured to:
   detect a first voltage at a pin of the PMIC; and
   regulate a second voltage supplied to a dynamic random access memory (DRAM) memory device on the DIMM based at least in part on the first voltage at the pin, wherein, to regulate the second voltage, the PMIC is configured to:
      disable one or more regulators of the PMIC based at least in part on the first voltage transitioning from a first level to a second level that is lower than the first level.

2. The memory system of claim 1, wherein the DIMM comprises a plurality of pins operable to couple the DIMM with a host device and the PMIC.

3. The memory system of claim 1, wherein the DIMM comprises a plurality of DRAM memory devices including at least the DRAM memory device.

4. A memory system, comprising:
a dual-in-line memory module (DIMM); and
a power management integrated circuit (PMIC) coupled with the DIMM, wherein the PMIC is configured to:
   detect a first voltage at a pin of the PMIC; and
   regulate a second voltage supplied to a dynamic random access memory (DRAM) memory device on the DIMM based at least in part on the first voltage at the pin, wherein, to regulate the second voltage, the PMIC is configured to:
      enable one or more regulators of the PMIC based at least in part on the first voltage transitioning from a first level to a second level that is higher than the first level.

5. The memory system of claim 4, wherein the DIMM comprises a plurality of pins operable to couple the DIMM with a host device and the PMIC.

6. The memory system of claim 4, wherein the DIMM comprises a plurality of DRAM memory devices including at least the DRAM memory device.

* * * * *